United States Patent
Jagannathan et al.

(10) Patent No.: US 9,978,748 B2
(45) Date of Patent: May 22, 2018

(54) METHOD OF CUTTING FINS TO CREATE DIFFUSION BREAKS FOR FINFETS

(71) Applicant: International Business Machines Corporation, Armonk, NY (US)

(72) Inventors: Hemanth Jagannathan, Niskayuna, NY (US); Sivananda K. Kanakasabapathy, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 14/964,445

(22) Filed: Dec. 9, 2015

(65) Prior Publication Data

US 2017/0170171 A1    Jun. 15, 2017

(51) Int. Cl.
| | |
|---|---|
| H01L 27/088 | (2006.01) |
| H01L 29/66 | (2006.01) |
| H01L 21/311 | (2006.01) |
| H01L 21/02 | (2006.01) |

(52) U.S. Cl.
CPC .... *H01L 27/0886* (2013.01); *H01L 21/02532* (2013.01); *H01L 21/31122* (2013.01); *H01L 21/31144* (2013.01); *H01L 29/6656* (2013.01); *H01L 29/66545* (2013.01); *H01L 29/66795* (2013.01)

(58) Field of Classification Search
CPC .......... H01L 27/0886; H01L 21/02532; H01L 21/31122; H01L 21/31144; H01L 29/6656; H01L 29/66795; H01L 29/66545; H01L 29/42376; H01L 29/0847; H01L 29/66621; H01L 29/66628; H01L 29/7834; H01L 29/267; H01L 29/0649
USPC .......... 257/348, E29.285, 392; 438/595, 585
See application file for complete search history.

(56) References Cited

U.S. PATENT DOCUMENTS

| | | | |
|---|---|---|---|
| 7,785,982 B2 | 8/2010 | Bedell et al. | |
| 8,293,627 B2 | 10/2012 | Lieten | |
| 8,368,127 B2 | 2/2013 | Zhu et al. | |
| 2005/0077553 A1 | 4/2005 | Kim et al. | |
| 2011/0062520 A1* | 3/2011 | Brask ................ | H01L 29/42376 257/348 |
| 2013/0178022 A1* | 7/2013 | Cheng ............... | H01L 29/66795 438/157 |
| 2013/0224945 A1* | 8/2013 | Liu .................... | H01L 29/66795 438/595 |
| 2014/0319543 A1* | 10/2014 | Yin ..................... | H01L 29/0684 257/77 |
| 2015/0097217 A1 | 4/2015 | Cheng et al. | |
| 2015/0140787 A1 | 5/2015 | Zhang et al. | |

(Continued)

*Primary Examiner* — David Vu
*Assistant Examiner* — Mouloucoulaye Inoussa
(74) *Attorney, Agent, or Firm* — Louis J. Percello, Esq.; Otterstedt, Ellenbogen & Kammer, LLP

(57) ABSTRACT

A method is provided for forming an integrated circuit with FinFETs. Initially, a fin is received with a dummy gate passing thereover. The dummy gate is removed to form a space over the fin. A temporary layer is subsequently placed in the space, and an element from the temporary layer is caused to pass into a portion of the fin to form a modified fin portion. After the temporary layer is removed, at least part of the modified fin portion is etched away to form a gap in the fin.

18 Claims, 7 Drawing Sheets

(56) References Cited

U.S. PATENT DOCUMENTS

2015/0206744 A1\* 7/2015 Cheng .............. H01L 21/76224
438/152

\* cited by examiner

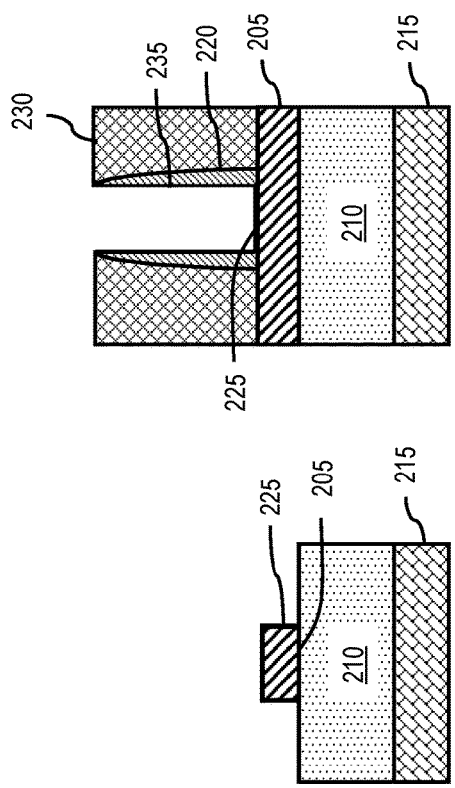
FIG. 4A
FIG. 4B
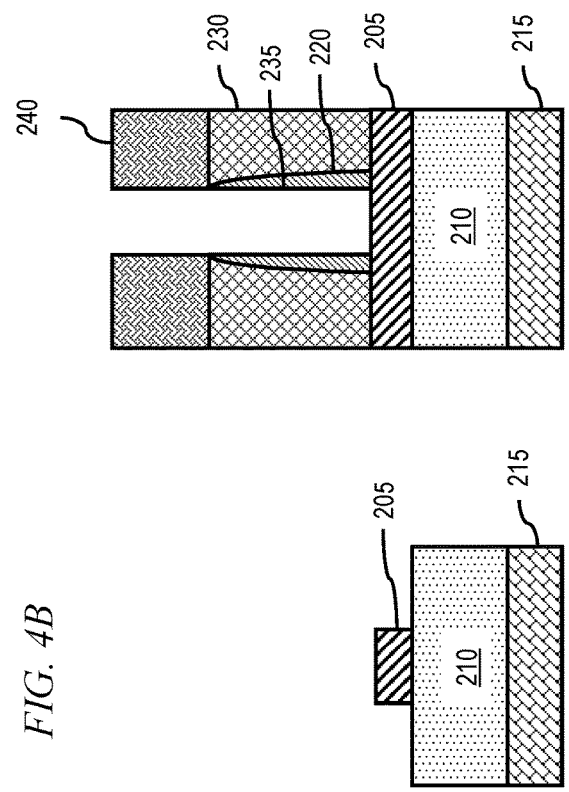
FIG. 5A
FIG. 5B

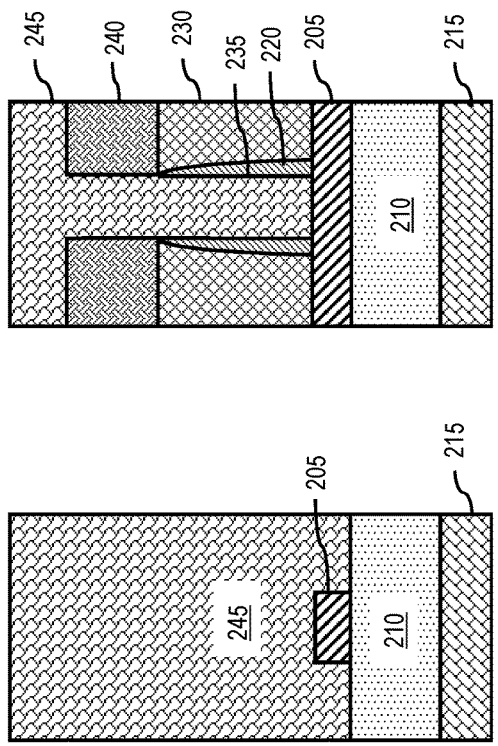
FIG. 6A
FIG. 6B
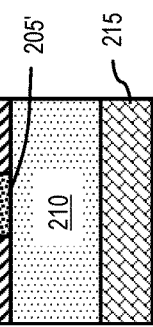
FIG. 7A
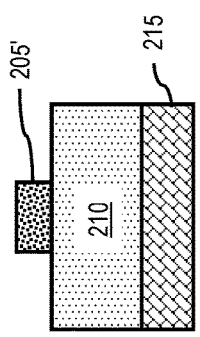
FIG. 7B

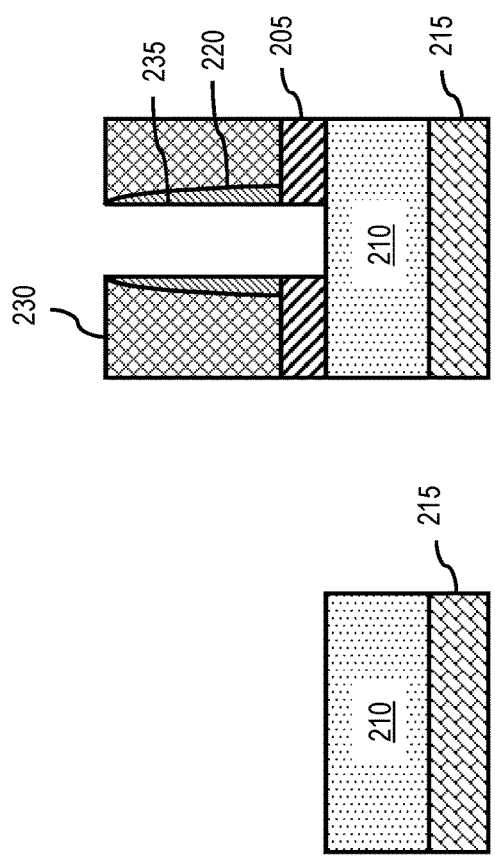
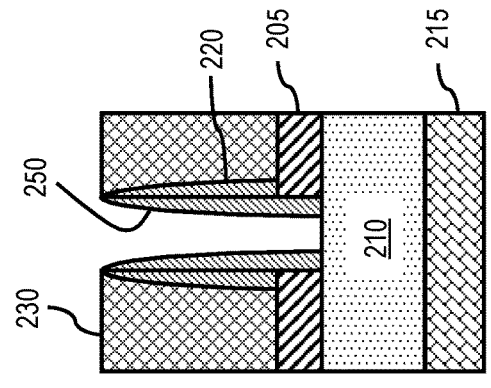
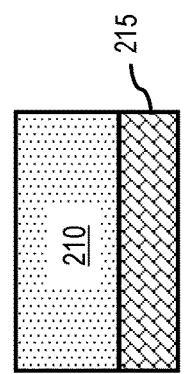

– continued –

METHOD OF CUTTING FINS TO CREATE DIFFUSION BREAKS FOR FINFETS

BACKGROUND

The present invention relates to the electrical, electronic, and computer arts, and, more particularly, to methods for cutting fins in integrated circuits comprising FinFETs.

Multi-gate field-effect transistors (FETs) are of considerable interest because of their superior electrostatic integrity, as well as their promise of lower supply voltages, reduced threshold voltages, and extended scalability. FinFETs are one form of such multi-gate device. In a FinFET, a narrow channel feature (i.e., fin) is raised above the substrate and passes under a gate, which effectively wraps around the fin. The gate is thereby capacitively coupled to the top as well as the sides of the fin. So structured, very little leakage current passes through channel portions of the fin when the device is in the off state. This allows the use of lower threshold voltages and higher switching speeds.

A single fin may initially be patterned to span across regions that will ultimately be separated into multiple FinFETs. Later, after forming additional elements such as gates and contacts, the fin may be cut to isolate one transistor from another. Ideally, such cutting will utilize as small an area as possible. Nevertheless, cutting just the fins without simultaneously damaging the nearby structures remains challenging. Gas phase plasmas, for example, may be made somewhat selective to silicon, but have enough plasma potential to also etch nearby dielectric materials.

SUMMARY

Embodiments of the invention provide a means for cutting fins in integrated circuits with FinFETs so as to isolate one transistor device from another. Advantageously, the cut may be accomplished in about the width of a gate, making the process extremely space-efficient. Moreover, the ends of the cut fin portions may be terminated in sidewall spacers that both electrically isolate these fin portions, as well as protect them during further processing.

Aspects of the invention are directed to a method for forming an integrated circuit. Initially, a fin is received with a dummy gate passing thereover. The dummy gate is removed to form a space over the fin. A temporary layer is subsequently placed in the space, and an element from the temporary layer is caused to pass into a portion of the fin to form a modified fin portion. After the temporary layer is removed, at least part of the modified fin portion is etched away to form a gap in the fin.

Additional aspects of the invention are directed to an integrated circuit formed at least in part using a method like that set forth in the previous paragraph.

Lastly, even additional aspects of the invention are directed to an integrated circuit comprising a gate, a first fin portion ending in a first terminus, and a second fin portion lined up with the first fin portion and ending in a second terminus. The first terminus and the second terminus are separated by about the width of the gate.

BRIEF DESCRIPTION OF THE SEVERAL VIEWS OF THE DRAWINGS

These and other features, aspects, and advantages of the present invention will become better understood with regard to the following description, appended claims, and accompanying drawings where:

FIGS. 3A-9B show sectional views along the planes indicated in FIG. 2 of intermediate film stacks that are formed while performing the FIG. 1 method;

In the sectional views included herein, features present behind the sectional planes are not shown to reduce clutter and enhance clarity.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus twenty percent.

Figure 1:
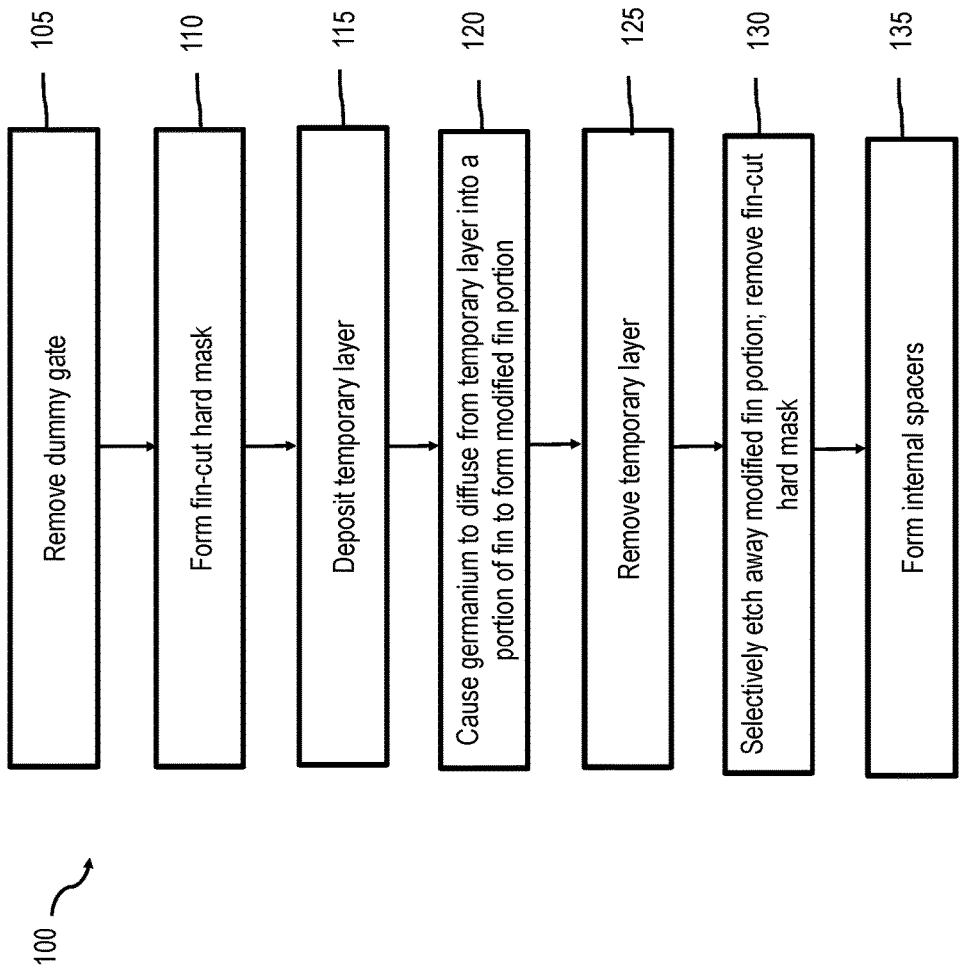
FIG. 1 shows a method for cutting a fin, in accordance with an illustrative embodiment of the invention.
Figure 2:
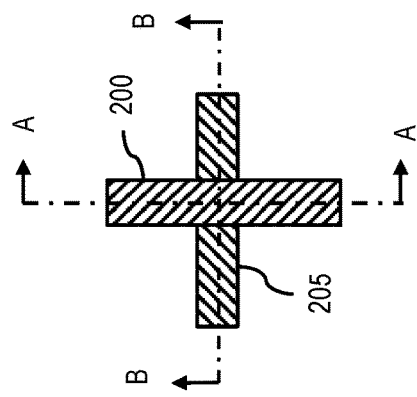
FIG. 2 shows a layout view of a portion of an integrated circuit while performing the FIG. 1 method.

FIG. 1 shows a flow diagram of a method 100 for cutting a fin in a FinFET, in accordance with an illustrative embodiment of the invention. As will be further elucidated below, the cutting of the fin occurs in a region of a fin that sits immediately below a dummy gate (i.e., a gate feature not intended for use as an active device). Such a region is shown in a layout view in FIG. 2. In FIG. 2, a representative dummy gate 200 passes over a representative fin 205. It is intended that the portion of the fin 205 immediately underneath the dummy gate 200 be cut. FIGS. 3A-9B, in turn, show sectional views of intermediate film stacks along the planes indicated in FIG. 2 as the method 100 is completed.

Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume 1*, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

Structural and functional aspects of MOSFETs and FinFETs are described in J. G. Fossum et al., *Fundamentals of*

*Ultra-Thin-Body MOSFETs and FinFETs*, Cambridge University Press, 2013, which is also hereby incorporated by reference herein.

Figure 3B:
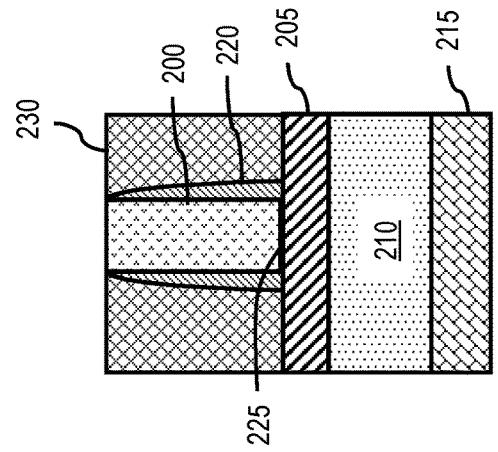
Figure 3A:
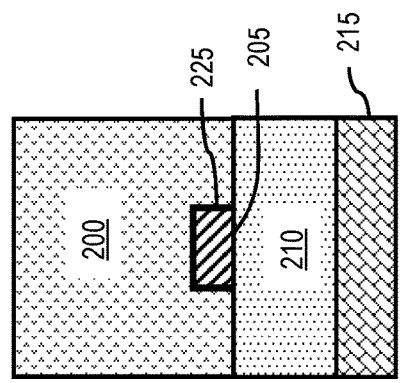

Before the method 100 is started, the integrated circuit comprising the dummy gate 200 and the fin 205 is already partially processed in a manner consistent with a gate-last or replacement metal gate (RMG) process flow. FIGS. 3A and 3B show the state of the region indicated in FIG. 2 at this point in the fabrication process. The fin 205 is disposed on a buried oxide (BOX) layer 210, which is itself positioned on top of a substrate 215. The dummy gate 200 passes over the fin 205 and, in so doing, contacts the fin 205 on three sides. Sidewall spacers 220 are formed on opposing sidewalls of the dummy gate 200. A gate dielectric 225 is disposed between the dummy gate 200 and the fin 205, and an intragate dielectric 230 is present on both sides of the dummy gate 200 and is planar with the top of the dummy gate 200.

In one or more non-limiting embodiments, the substrate 215 and the fin 205 may be formed of crystalline silicon, and the BOX layer 210, the intragate dielectric 230, and the gate dielectric 225 may be formed of silicon dioxide. The fin 205 may be doped with boron or phosphorous to be p- or n-type. The dummy gate 200 may be formed of polysilicon, and the sidewall spacers 220 may be formed of lower-k dielectric materials, such as, siliconborocarbonitride (SiBCN), siliconoxycarbonitride (SiOCN), siliconoxycarbide (SiOC), or some combination thereof.

The method starts in step 105 with the removal of the dummy gate 200 by, for example, wet etching in hot ammonia (selective to dielectrics) to yield the film stack in FIGS. 4A and 4B. Such processing leaves a space 235 over the fin 205. The space 235 is bordered on two sides by the sidewall spacers 220.

Next, in step 110, a fin-cut hard mask 240 is formed on the film stack in FIGS. 4A and 4B to yield the film stack in FIGS. 5A and 5B. A purpose of the fin-cut hard mask 240 is to define which fins will be cut and which will remain intact. In the present illustrative embodiment, the fin-cut hard mask 240 is open over the space 235 previously occupied by the dummy gate 200. In contrast, the fin-cut hard mask 240 is intact over other gates where a fin is not to be cut. In one or more embodiments, the fin-cut hard mask 240 may comprise silicon nitride, and may be formed by conventional deposition, photolithographic, and anisotropic etching steps. Deposition of the fin-cut hard mask 240 may be by chemical vapor deposition (CVD). A photoresist may then be patterned on top of the fin-cut hard mask 240 and its pattern transferred to the underlying material via reactive ion etching (ME). The gate dielectric 225 may also be removed during the same ME step, or a subsequent ME step. The photoresist may then be stripped. At this point in the method 100, a portion of the fin 205 immediately below the space 235 is exposed. This is the portion of the fin 205 to be cut.

Step 115 of the method 100 involves depositing a germanium-containing temporary layer 245 into the space 235 previously occupied by the dummy gate 200 so that the temporary layer 245 envelopes three faces of the exposed portion of the fin 205. The resultant film stack is shown in FIGS. 6A and 6B. The temporary layer 245 may comprise, for example, polycrystalline germanium, amorphous germanium, or some combination of these phases. In alternative embodiments, the temporary layer 245 may comprise germanium mixed with another element (e.g., silicon). Deposition may be by a conformal deposition process such as, for example, CVD using germane and hydrogen and/or nitrogen as gas-phase reactants. Deposition will also occur on the top of the fin-cut hard mask 240, as indicated in the figures.

Germanium from the temporary layer 245 is then driven into the underlying fin 205 in step 120. This diffusion process may be performed by, for example, annealing. Once the drive-in is completed, the temporary layer 245 may be removed, leaving the film stack shown in FIGS. 7A and 7B. Removal of the temporary layer 245 may be accomplished by, for example, wet etching in hydrogen peroxide, which tends to etch silicon and dielectric materials quite slowly. At this point in the process, the portion of the fin 205 immediately below the space 235 has been modified in relation to the remainder of the fin 205 because of the inclusion of germanium from the temporary layer 245, and this germanium-containing portion is now labeled and referenced as a "modified fin portion" 205'. While not explicitly shown in the figures, some of the germanium from the temporary layer 245 may migrate into portions of the fin 205 underlying the sidewall spacers 220, but this lateral spreading is not particularly critical so long as it is not excessive. The extent of such migration may be controlled by the annealing temperature as well as time-at-temperature.

With the modified fin portion 205' now comprising a significant concentration of germanium, step 130 involves selectively removing the modified fin portion 205' without significantly altering the exposed portions of the unmodified fin 205 (e.g., silicon), the BOX layer 210 (e.g., silicon dioxide), the fin-cut hard mask 245 (e.g., silicon nitride), and the sidewall spacers 220 (e.g., SiBCN, SiOCN, and/or SiOC). Silicon-germanium tends to be very susceptible to etching by hydrogen chloride. Therefore, in one or more embodiments, step 130 may utilize vapor phase etching (VPE) with hydrogen chloride to remove the modified fin portion 205'. With the fin 205 now cut, the fin-cut hard mask 240 may be etched away via wet etching. This wet etching may include, for example, hot phosphoric acid, which would etch silicon nitride selective to the other exposed materials. The resultant film stack is shown in FIGS. 8A and 8B.

Finally, with the fin 205 now cut, step 135 has additional inside sidewall spacers 250 formed inside the space 235 left between the original sidewall spacers 220. That is, the inside sidewall spacers 250 occupy a region from which the modified fin portion 205' has been etched away. The resultant film stack is shown in FIGS. 9A and 9B. The inside sidewall spacers 250 may comprise silicon nitride or silicon oxynitride, and may be formed by a conventional spacer formation process, namely, a conformal deposition process (e.g., CVD) followed by an anisotropic etch process (e.g., ME) that acts to remove the just-deposited material from the horizontal surfaces. After formation, the inside sidewall spacers 250 act to both electrically isolate the ends of the fins 205 as well as protect these fins 205 during subsequent processing.

Thus, the method 100, and more generally, methods falling within the scope of the invention, are operative to effectively cut a fin within the confines of a single gate. So cut, what was once a single fin, now defines a first fin with a first terminus, and a second fin with a second terminus in spaced relation to the first terminus and in line with the first fin (FIG. 9B). The distance between the first terminus and the second terminus is about equal to the width of a dummy gate that originally occupied the space immediately above the cut fin.

Figure 10:
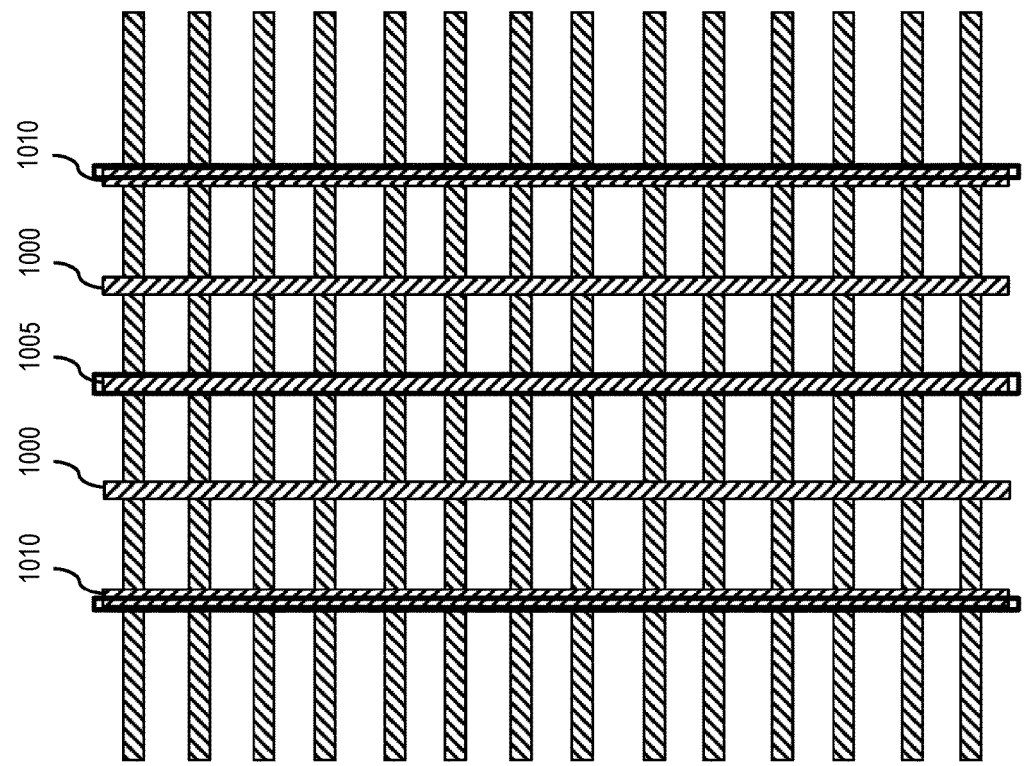
FIG. 10 shows a layout view of a portion of an integrated circuit, in accordance with an illustrative embodiment of the invention; an FIG. 11 shows a sectional view of an edge portion of the FIG. 10 integrated circuit after performing the FIG. 1 method.

The method 100 thereby becomes an excellent way to cut fins in a space-efficient manner in integrated circuits comprising FinFETs. FIG. 10 shows a layout view of an exemplary region of a partially-formed integrated circuit, in accordance with an illustrative embodiment of the invention. In this integrated circuit, fins have been formed running left-to-right, and dummy have been formed up-down so that the gates cross over the fins.

The region of the integrated circuit shown in FIG. 10 comprises two dummy gates 1000 that will ultimately be replaced by active gate conductors to regulate two separate banks of FinFETs. A middle dummy gate 1005 is disposed between the two banks of FinFETs. Edge dummy gates 1010 are positioned at the edges of the banks. Notably, the fins in the left bank are continuous with the fins in the right bank. That is, the fins have not yet been cut, and the banks are not yet electrically isolated.

Figure 11:
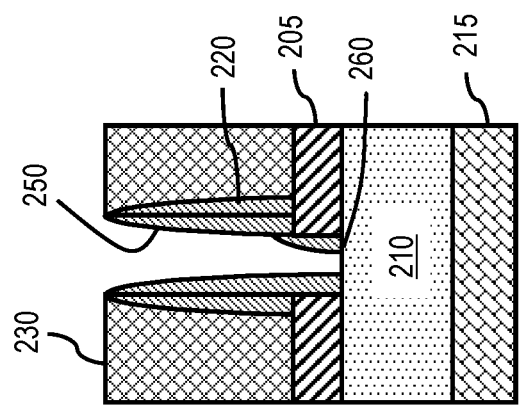

The method 100 may be utilized to cut the fins under the middle and edge dummy gates 1005, 1010. The regions covered and uncovered by the fin cut mask are indicated in FIG. 10. The regions of the integrated circuit falling outside the indicated boundaries are covered, while the regions within the indicated boundaries are not covered. Accordingly, it will be observed that the fin-cut mask exposes the middle dummy gate 1005 and about half of each of the edge dummy gates 1010. With this fin-cut mask, practicing the method 100 has the effect of cutting the fins immediately underneath the middle dummy gate 1005. In this manner, the two banks of FinFETs are isolated from each other in the width of about a gate, in the manner indicated in FIGS. 9A and 9B. At the same time, underneath the edge dummy gates 1010, a film stack similar to that shown in the sectional view in FIG. 11 is produced (where the cleave plane is parallel to the fin 205). In this edge region, a terminus of the fin 205 is covered in a self-aligned sidewall spacer 260 that effectively isolates that portion of the fin 205 from subsequent processing steps.

The formation of a diffusion break in a fin in about the width of a dummy gate is extremely space-efficient. It should be compared to, for example, other designs wherein the entire region between two gates is utilized to create a diffusion break. The smaller area in accordance with methods set forth herein is due at least in part to the excellent selectivity that is achieved when etching portions of fins that have been converted to silicon-germanium.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the invention.

It should again be emphasized that the above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts. In other embodiments, for example, a FinFET may be formed with III-V materials, and the temporary layer modified to include an element that, when driven into a fin, allows a portion of that fin to be etched away with high selectivity to the surrounding structures.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming an integrated circuit, the method comprising the steps of:
   receiving a fin with a dummy gate passing thereover;
   removing the dummy gate to form a space over the fin;
   placing a temporary layer into the space;
   causing an element from the temporary layer to pass into a portion of the fin to form a modified fin portion;
   removing the temporary layer; and
   etching away at least part of the modified fin portion to form a gap in the fin.

2. The method of claim 1, wherein a width of the gap is about equal to a width of the dummy gate.

3. The method of claim 1, further comprising the step of forming a mask with an opening overlying the space.

4. The method of claim 3, wherein the step of placing the temporary layer is performed with the mask in place.

5. The method of claim 3, wherein the step of causing an element from the temporary layer to pass into the portion of the fin is performed with the mask in place.

6. The method of claim 3, wherein the step of removing the temporary layer is performed with the mask in place.

7. The method of claim 1, wherein the dummy gate comprises polysilicon.

8. The method of claim 7, wherein the space is bordered on two sides by sidewall spacers.

9. The method of claim 8, wherein the sidewall spacers comprise at least one of siliconborocarbonitride, siliconoxycarbonitride, and siliconoxycarbide.

10. The method of claim 1, wherein:
    the fin comprises silicon; and
    the temporary layer comprises germanium.

11. The method of claim 1, wherein the temporary layer comprises amorphous or polysilicon germanium.

12. The method of claim 1, wherein the step of causing the element from the temporary layer to pass into the portion of the fin comprises annealing.

13. The method of claim 1, wherein the step of removing the temporary layer comprises wet etching.

14. The method of claim 1, wherein the step of etching away at least part of the modified fin portion comprises vapor phase etching.

15. The method of claim 14, wherein the vapor phase etching utilizes hydrogen chloride.

16. The method of claim 1, further comprising forming a set of inside sidewall spacers occupying a region from which the modified fin portion has been etched away.

17. An integrated circuit formed at least in part by performing the steps of:

receiving a fin with a dummy gate passing thereover;
removing the dummy gate to form a space over the fin;
placing a temporary layer into the space;
causing an element from the temporary layer to pass into a portion of the fin to form a modified fin portion;
removing the temporary layer; and
etching away at least part of the modified fin portion to form a gap in the fin.

18. The integrated circuit of claim 17, wherein:
the fin comprises silicon; and
the temporary layer comprises germanium.

\* \* \* \* \*